(12) United States Patent
Tomoda et al.

(10) Patent No.: US 10,295,637 B2
(45) Date of Patent: May 21, 2019

(54) SCAN CONDITION DETERMINING APPARATUS, MAGNETIC RESONANCE APPARATUS, SCAN CONDITION DETERMINING METHOD, AND PROGRAM

(71) Applicant: General Electric Company, Schenectady, NY (US)

(72) Inventors: Yoshihiro Tomoda, Hino (JP); Masanori Ozaki, Hino (JP)

(73) Assignee: General Electric Company, Schenctady, NY (US)

( * ) Notice: Subject to any disclaimer, the term of this patent is extended or adjusted under 35 U.S.C. 154(b) by 451 days.

(21) Appl. No.: 15/010,518

(22) Filed: Jan. 29, 2016

(65) Prior Publication Data
US 2016/0209485 A1  Jul. 21, 2016

(30) Foreign Application Priority Data

Jan. 30, 2015  (JP) .................................. 2015-016181

(51) Int. Cl.
*G01R 33/54* (2006.01)

(52) U.S. Cl.
CPC .................................. *G01R 33/546* (2013.01)

(58) Field of Classification Search
CPC ........................... G01R 33/543; G01R 33/546; G01R 33/5608; G01R 33/4835; G01R 33/4838; G01R 33/5607; G01R 33/56341; A61B 5/0037; A61B 5/055; A61B 5/7221; A61B 6/545
See application file for complete search history.

(56) References Cited

U.S. PATENT DOCUMENTS

| 2010/0308829 A1* | 12/2010 | Vu ....................... G01R 33/288 324/314 |
| 2011/0044524 A1* | 2/2011 | Wang ..................... G01R 33/54 382/131 |
| 2011/0144474 A1* | 6/2011 | Ouwerkerk ............ A61B 5/055 600/410 |
| 2015/0071514 A1* | 3/2015 | Wang ................... A61B 5/7221 382/131 |

(Continued)

FOREIGN PATENT DOCUMENTS

| JP | 2004-135997 A | 5/2004 |
| JP | 2011-229546 A | 11/2011 |
| WO | 2003-021284 A1 | 3/2003 |

OTHER PUBLICATIONS

English Translation of the JP OA for Application No. 2015-016181 . Office Action dated Sep. 5, 2017. 3 pages.

*Primary Examiner* — Gregory H Curran

(57) ABSTRACT

There is provided a scan condition determining apparatus, comprising: setting means for setting values of a plurality of parameters different from a repetition time and different from a bandwidth; and determining means for determining a specific value of the bandwidth based on the set values of the plurality of parameters such that a repetition time determined as a longer one of a first period of time and a second period of time is minimized, the first period of time being a time taken to perform a pulse sequence in one cycle, and the second period of time being a time taken from the start of a pulse sequence in one cycle until a pulse sequence in a next cycle is ready to perform determined by the thermal design restrictions of a gradient coil.

17 Claims, 9 Drawing Sheets

(56) References Cited

U.S. PATENT DOCUMENTS

| | | | | |
|---|---|---|---|---|
| 2015/0157207 A1* | 6/2015 | Ikeda | .................. | A61B 6/545 |
| | | | | 600/410 |
| 2016/0077179 A1* | 3/2016 | Tomoda | ............... | G01R 33/543 |
| | | | | 324/314 |
| 2016/0349342 A1* | 12/2016 | Cohen | .................. | G01R 33/543 |
| 2017/0023657 A1* | 1/2017 | Tomoda | ............... | G01R 33/543 |
| 2017/0212196 A1* | 7/2017 | Feiweier | .............. | G01R 33/307 |
| 2017/0351937 A1* | 12/2017 | Lu | ......................... | A61B 5/055 |

* cited by examiner

FIG.3

| | | | | |
|---|---|---|---|---|
| Scan Time: | 0:20 | | | |
| Feq.FOV: | 23 | Feq.Dir: | R/L | C2 |
| Slice Thickness: | 5.0 | TR: | 3.8 | |
| Spacing: | 1.0 | #Slices: | 30 | |
| # of TE per Scan | 1.0 | Feq.: | 288 | |
| TE | 120 | Phase: | 224 | |
| | | NEX: | 1.00 | |
| | | Band Width: | 62.5 | C1 |

FIG.4

| Scan Time: | 0:17 | | | |
|---|---|---|---|---|
| Feq.FOV: | 23 | | Feq.Dir: | R/L  C2 |
| Slice Thickness: | 5.0 | | TR: | 3.2 |
| Spacing: | 1.0 | | #Slices: | 30 |
| # of TE per Scan | 1.0 | | Feq.: | 288 |
| TE | 120 | | Phase: | 224 |
| | | | NEX: | 1.00 |
| | | | Band Width: | Auto |
| | | | | C1 |

SCAN CONDITION DETERMINING APPARATUS, MAGNETIC RESONANCE APPARATUS, SCAN CONDITION DETERMINING METHOD, AND PROGRAM

CROSS-REFERENCE TO RELATED APPLICATIONS

This application claims priority to Japanese patent application number 2015-016181, filed on Jan. 30, 2015, the entirety of which is incorporated herein by reference.

BACKGROUND

Known scan methods in magnetic resonance imaging include a scan method called 3D-FSPGR (Three-Dimensional Fast SPoiled GRadient echo). The scan method has a characteristic that it requires relatively long breath-holding of a subject. Another known scan method is one called 2D/3D-SSFP (Two-Dimensional/Three-Dimensional Steady State Free Precession). The scan method has a characteristic that it suffers from increased banding artifacts when a pulse sequence has a long repetition time TR. Accordingly, when any of these scan methods is used, it is necessary to set scan conditions such that the repetition time TR is as short as possible and consequently the scan time ST is reduced. Generally, the repetition time TR has strong dependency upon the bandwidth BW. In many cases, other parameters than the repetition time TR and bandwidth BW are set to specific values according to the purpose. Therefore, the operator should specify the other parameters than the repetition time TR and bandwidth BW, and then, optimize the bandwidth BW in order that the repetition time TR may be as short as possible.

Moreover, in the case that a large FOV (Field Of View) is defined for a subject having a large sized body or that reduced spatial resolution is applied to reduce the scan time ST for a subject who cannot hold his/her breath for a long time, it is necessary to successively optimize the value of the bandwidth BW during a real-time operation (see Abstract in Patent Document 1). The term real-time operation refers to a procedure of loading a site protocol and then modifying parameters on the spot. For example, a case may be assumed in which parameters should be modified after a patient has been laid over a table of an imaging apparatus in a hospital or the like. In this case, there is not enough time to modify parameters and no setting mistake is allowed, so that the procedure is highly difficult.

In optimizing the value of the bandwidth BW so that the repetition time TR is as short as possible as described above, the current operation involves the operator modifying the set value for the bandwidth BW while observing subsequent variation of the repetition time TR and/or scan time ST, and searching for an optimal specific value $BW_{tr\_min}$ of the bandwidth BW to minimize these values.

Such an operation of manually searching for an optimal specific value $BW_{tr\_min}$ of the bandwidth BW is, however, extremely cumbersome and significantly interferes with workflow.

By such circumstances, it is desired to provide a technique that facilitates optimization of the scan conditions, particularly, the value of the bandwidth BW, in a magnetic resonance apparatus.

SUMMARY

In a first aspect, provided is a scan condition determining apparatus, comprising setting means for setting values of a plurality of parameters different from a repetition time and different from a bandwidth; and determining means for determining a specific value of said bandwidth based on said set values of said plurality of parameters such that a repetition time determined as a longer one of a first period of time and a second period of time is minimized, said first period of time being a time taken to perform a pulse sequence in one cycle, and said second period of time being a time taken from the start of a pulse sequence in one cycle until a pulse sequence in a next cycle is ready to perform determined by the thermal design restrictions of a gradient coil.

As used herein, the phrase "a pulse sequence in one cycle" refers to a combination of a plurality of magnetic field pulses periodically generated in a pulse sequence, which combination corresponds to a series of processing from generation of an excitation pulse to reception of a magnetic resonance signal.

In a second aspect, provided is the scan condition determining apparatus in the first aspect, wherein said determining means obtains said repetition time for said bandwidth assuming each of a plurality of mutually different values, and determines said specific value based on said obtained repetition times.

In a third aspect, provided is the scan condition determining apparatus in the second aspect, wherein said determining means searches for said specific value using a solution to a minimization problem.

In a fourth aspect, provided is the scan condition determining apparatus in the third aspect, wherein said determining means searches for said specific value using a bisection method.

In a fifth aspect, provided is the scan condition determining apparatus in the fourth aspect, wherein: said determining means searches for said specific value by binary search, ternary search or golden search.

In a sixth aspect, provided is the scan condition determining apparatus in the third aspect, wherein: said determining means searches for said specific value using a gradient method, a Newton's method or a Monte Carlo method.

In a seventh aspect, provided is the scan condition determining apparatus in the first aspect, wherein: said determining means estimates a first curved or straight line representing change of said first period of time with respect to the value of said bandwidth and a second curved or straight line representing change of said second period of time with respect to the value of said bandwidth, and determines a value of the bandwidth corresponding to an intersection of said first and second curved or straight lines as said specific value.

In an eighth aspect, provided is the scan condition determining apparatus in the first aspect, wherein when a first mode involving adjustment of a pulse sequence so that said first period of time is balanced with said second period of time is selected, said determining means obtains said repetition time for said bandwidth assuming each of a plurality of mutually different values, and determines said specific value based on said obtained repetition times, and when a second mode without said adjustment is selected, said determining means estimates a first curved or straight line representing change of said first period of time with respect to the value of said bandwidth and a second curved or straight line representing change of said second period of time with respect to the value of said bandwidth, and determines a value of the bandwidth corresponding to an intersection of said first and second curved or straight lines as said specific value.

In a ninth aspect, provided is the scan condition determining apparatus in any one of the first through eighth aspects, wherein said setting means sets turning on/off of a function of automatically setting said bandwidth in response to an operation by an operator, and said determining means determines said specific value when said function is turned on.

In a tenth aspect, provided is the scan condition determining apparatus in any one of the first through ninth aspects, wherein said plurality of parameters are used in a scan according to a scan method of 3D-FSPGR (Three-dimensional fast spoiled gradient echo) or 2D/3D-SSFP (Two-dimensional/Three-dimensional steady state free precession).

In an eleventh aspect, provided is a magnetic resonance apparatus comprising the scan condition determining apparatus in any one of the first through tenth aspects.

In a twelfth aspect, provided is a scan condition determining method comprising a setting step of setting values of a plurality of parameters different from a repetition time and different from a bandwidth; and a determining step of determining a specific value of said bandwidth based on said set values of said plurality of parameters such that a repetition time determined as a longer one of a first period of time and a second period of time is minimized, said first period of time being a time taken to perform a pulse sequence in one cycle, and said second period of time being a time taken from the start of a pulse sequence in one cycle until a pulse sequence in a next cycle is ready to perform determined by the thermal design restrictions of a gradient coil.

In a thirteenth aspect, provided is a program for causing a computer to execute setting processing of setting values of a plurality of parameters different from a repetition time and different from a bandwidth; and determining processing of determining a specific value of said bandwidth based on said set values of said plurality of parameters such that a repetition time determined as a longer one of a first period of time and a second period of time is minimized, said first period of time being a time taken to perform a pulse sequence in one cycle, and said second period of time being a time taken from the start of a pulse sequence in one cycle until a pulse sequence in a next cycle is ready to perform determined by the thermal design restrictions of a gradient coil.

According to the invention in the aspects described above, a specific value of the bandwidth that minimizes the repetition time is determined by automatically searching for it, which eliminates the need for an operation by an operator of manually checking such a specific value of the bandwidth, thus facilitating optimization of the scan conditions.

BRIEF DESCRIPTION OF THE DRAWINGS

FIG. 3 is a diagram showing an exemplary display screen in determining scan conditions.

FIG. 4 is a diagram showing an exemplary display screen when "Auto" is input to input fields C1 and C2.

DETAILED DESCRIPTION

Figure 1:
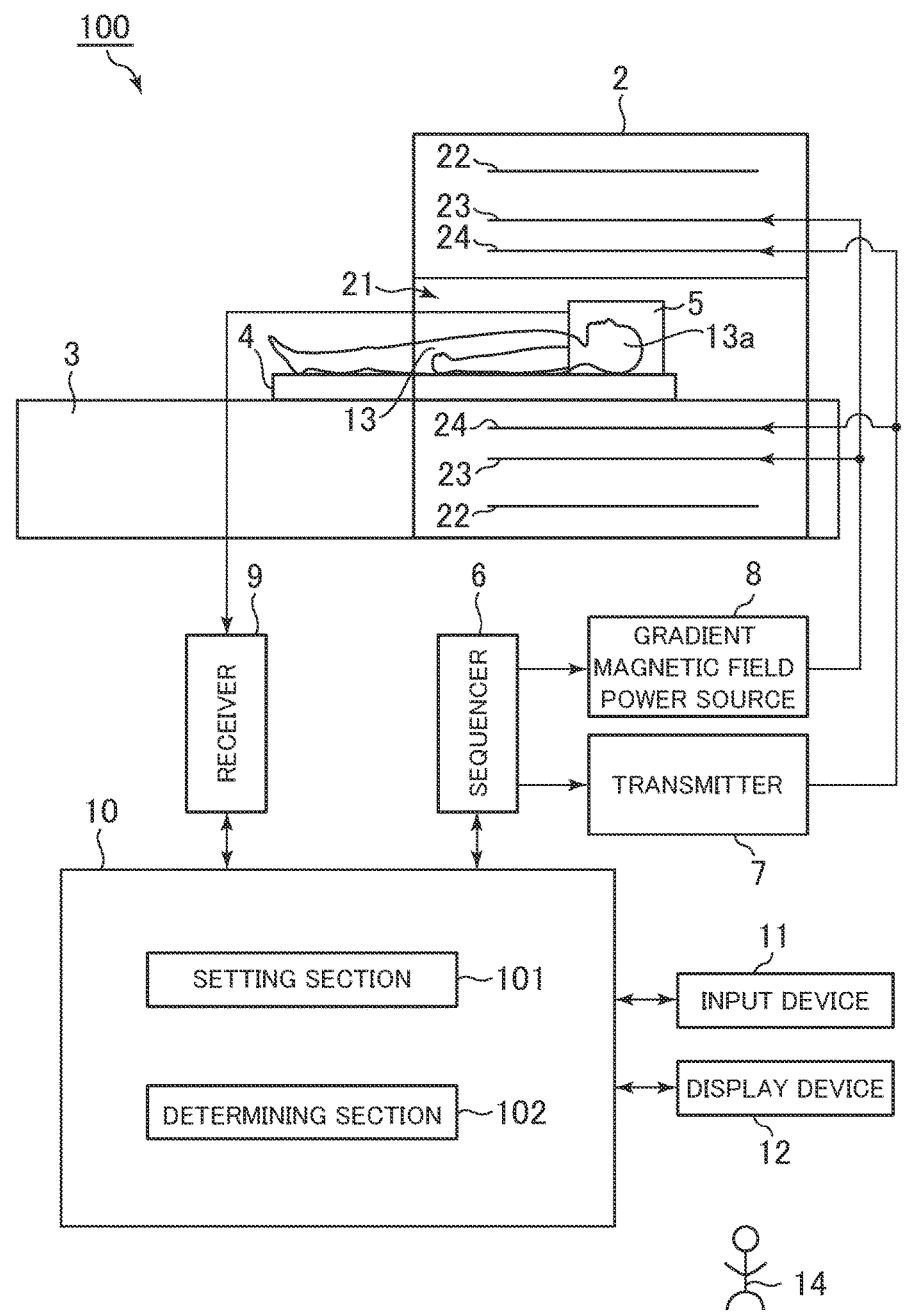
FIG. 1 is a schematic diagram of a magnetic resonance imaging apparatus representing one embodiment of the invention.

FIG. 1 is a schematic diagram of a magnetic resonance imaging apparatus representing one embodiment of the invention.

A magnetic resonance imaging (MRI) apparatus 100 comprises a magnetic field generating apparatus 2, a table 3, a cradle 4, and a receive coil (receiving coil) 5.

The magnetic field generating apparatus 2 has a bore 21 into which a subject 13 is received, a super-conductive coil 22, a gradient coil 23, and a transmit coil 24. The super-conductive coil 22 applies a static magnetic field BO, and a gradient coil 23 applies gradient magnetic fields in a frequency-encoding direction, a phase-encoding direction, and a slice-selective direction. The transmit coil 24 transmits an RF pulse. It should be noted that a permanent magnet may be employed in place of the super-conductive coil 22.

The cradle 4 is configured to be movable from the table 3 into the bore 21. By the cradle 4, the subject 13 is carried into the bore 21.

The receive coil 5 is attached to a head 13a of the subject 13. The receive coil 5 receives magnetic resonance signals from the head.

The MRI apparatus 100 further has a sequencer 6, a transmitter 7, a gradient magnetic field power source 8, a receiver 9, a central processing apparatus 10, an input device 11, and a display device 12.

The sequencer 6 transmits information for performing a scan to the transmitter 7 and gradient magnetic field power source 8 in response to control of the central processing apparatus 10. In particular, the sequencer 6 sends information on RF (Radio Frequency) pulses (the central frequency, bandwidth, etc.) to the transmitter 7, and information on the gradient magnetic field (the intensity of the gradient magnetic field, etc.) to the gradient magnetic field power source 8 in response to control of the central processing apparatus 10.

The transmitter 7 outputs a driving signal for driving the RF coil 24 based on the information sent from the sequencer 6.

The gradient magnetic field power source 8 outputs a driving signal for driving the gradient coil 23 based on the information sent from the sequencer 6.

The receiver 9 applies signal processing to the magnetic resonance signals received at the receive coil 5 and transmits the resulting signals to the central processing apparatus 10.

The central processing apparatus 10 controls operation of several sections in the MRI apparatus 100 to implement several kinds of operation of the MRI apparatus 100, such as an operation of transmitting required information to the sequencer 6 and display device 12, and an operation of reconstructing images based on the signals received from the receiver 9. The central processing apparatus 10 also comprises a setting section 101 and a determining section 102.

The setting section 101 sets, among a large number of parameters for determining scan conditions, values of a plurality of parameters except the repetition time TR and bandwidth BW.

The determining section 102 determines a repetition time TR and a specific value of the bandwidth BW that minimizes the repetition time TR based on the values of the plurality of parameters, except the repetition time TR and bandwidth BW, set by the setting section 101.

The central processing apparatus 10 is constructed by, for example, a computer, and it functions as these sections by executing predefined programs. The setting section 101 and determining section 102 represent examples of the setting means and determining means in the invention, respectively.

The input device 11 inputs several kinds of instructions to the central processing apparatus 10 in response to an operation by the operator 14. The display device 12 displays several kinds of information.

The MRI apparatus 100 is able to determine a value of the bandwidth BW for collecting data of MR images in as short a repetition time TR as possible, i.e., in as short a scan time ST as possible, based on the set values of the plurality of parameters except the repetition time and bandwidth. Now description will be made of how such a bandwidth BW is determined.

Figure 2:
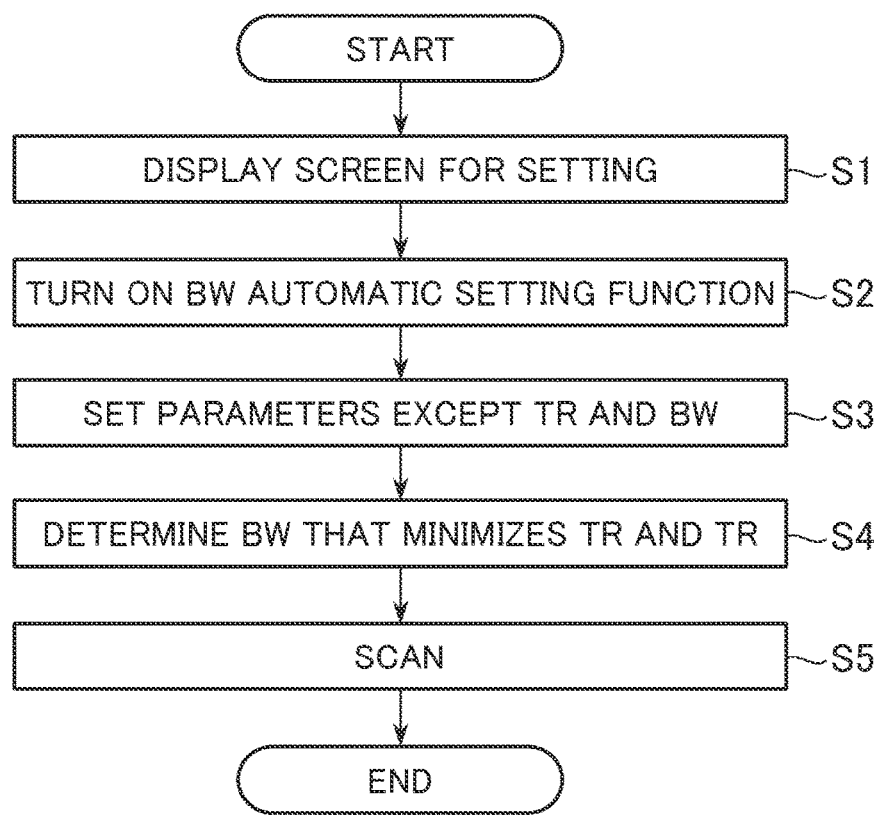
FIG. 2 is a diagram showing the flow of processing in the MRI apparatus in determining scan conditions.

FIG. 2 is a diagram showing the flow of processing in the MRI apparatus 100 in determining scan conditions.

At Step S1, the operator 14 first makes an operation of displaying a screen for determining scan conditions in the display device 12. The central processing apparatus 10 displays the screen for determining scan conditions in the display device 12 in response to the operation. It is assumed here that a scan is performed using a scan method, such as 3D-FSPGR or 2D/3D-SSFP, in which minimization of the repetition time TR, i.e., the scan time ST, is given the higher priority.

FIG. 3 is a diagram showing an exemplary display screen in determining scan conditions.

The example in FIG. 3 shows input or display fields for a large number of parameters for determining scan conditions. It also shows a scan time ST when a scan is performed with scan conditions determined by the large number of parameters. The large number of parameters include, for example, the cross section for imaging (Scan Plane), FOV in the frequency-encoding direction (Freq. FOV), Slice Thickness, inter-slice spacing (Spacing), frequency-encoding direction (Freq. Dir), repetition time (TR), number of slices (#Slices), echo time (TE), number of echo times that can be defined for one scan (# of TE(s) per Scan), number of matrices in the frequency-encoding direction (Frequency), number of matrices in the phase-encoding direction (Phase), number of additions (NEX), and bandwidth (Band Width). The input or display fields for the large number of parameters display preset values and values calculated from the preset values, respectively.

Now let us focus upon the repetition time TR and bandwidth BW in the parameters.

The display screen shows an input field C1 for inputting a value of the bandwidth BW and a display field C2 for displaying the repetition time TR. The input field C1 for the bandwidth BW is input with a preset input value. The repetition time TR cannot be input or set, for which a minimized time is calculated, based on the values of the other parameters including the set value of the bandwidth BW, and the time is displayed in the display field C2.

At Step S2, the operator 14 decides whether the bandwidth BW should be manually set or automatically set. The example here assumes that the bandwidth BW is automatically set. In this case, the operator 14 inputs "Auto" in the input field C1 (see FIG. 4).

FIG. 4 is a diagram showing an exemplary display screen when "Auto" is input to the input field C1.

Once "Auto" has been input to the input field C1, the function of automatically setting the bandwidth BW is turned on.

At Step S3, the operator 14 inputs, among a large number of parameters, desired values for a plurality of parameters except the repetition time TR and bandwidth BW. The setting section 101 sets the input values to the plurality of parameters.

At Step S4, the determining section 102 determines a specific value $BW_{tr\_min}$ of the bandwidth BW that minimizes the repetition time TR and a repetition time $TR_{min}$ at that time based on the set values of the plurality of parameters. Details of the method of determining will be discussed later.

At Step S5, the central processing apparatus 10 controls several sections to perform a scan according to the determined scan conditions.

It should be noted that the operator 14 may perform the operation of turning on the function of automatically setting the bandwidth BW after setting desired ones of the values of the other parameters. In this case, the determining section 102 determines a specific value $BW_{tr\_min}$ of the bandwidth BW that minimizes the repetition time TR and a repetition time $TR_{min}$ at that time based on the set values of the other parameters in response to the operation of turning on the automatic setting function.

Now description will be made of the method of determining a specific value $BW_{tr\_min}$ of the bandwidth BW that minimizes the repetition time TR and a repetition time $TR_{min}$ at that time.

First, the repetition time TR and bandwidth BW will be particularly described.

Figure 5:
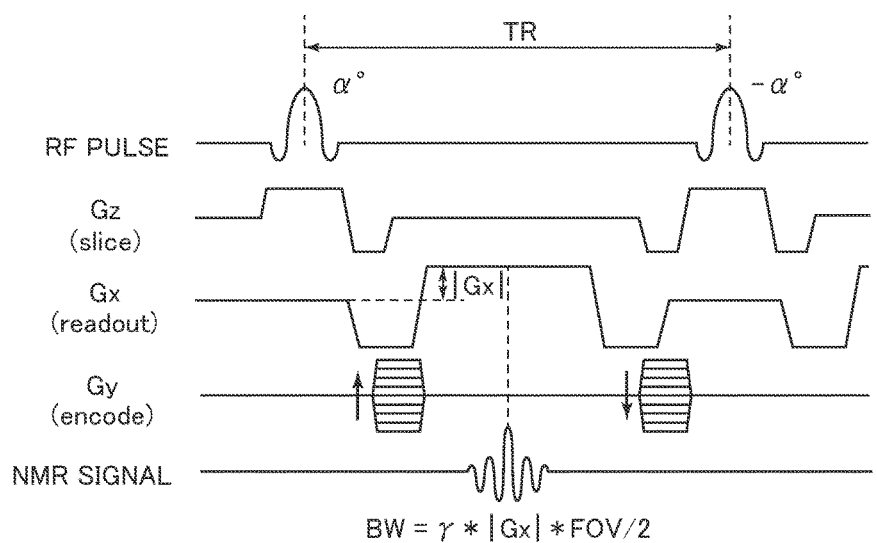
FIG. 5 is a diagram for explaining a repetition time TR and a bandwidth BW.

FIG. 5 is a diagram for explaining the repetition time TR and bandwidth BW.

As shown in FIG. 5, the repetition time TR is a period of time from an excitation pulse to a next excitation pulse, which is a fundamental cycle (time interval) for one combination of RF pulses repeated in a pulse sequence. That is, the repetition time TR is a period of time corresponding to a cycle in which a patterned pulse sequence is repetitively performed. In the spin echo technique, the period is a time from a 90-deg pulse to a next 90-deg pulse.

During imaging, information on the position is recognized as a difference in resonance frequency of echo signals by the gradient of a readout slope (gradient) magnetic field, so that the collected echo signals have components in a wide frequency band. The frequency band at that time is referred to as bandwidth BW. The bandwidth BW is proportional to the magnitude (height) |Gx| of the magnetic field Gx for the gradient pulse in a pulse sequence. The upper limit of the bandwidth BW depends upon the maximum output of a slope (gradient) magnetic field system in use.

Representing the magnitude of the magnetic field Gx for the gradient pulse as |Gx| [G/cm] and the gyromagnetic ratio as γ [kHz/G], BW [kHz]=γ[kHz/G]*|Gx| [G/cm]*FOV [cm]/2. In practice, |Gx|=BW/(γ*FOV/2) is determined according to the defined FOV and BW.

Figure 6:
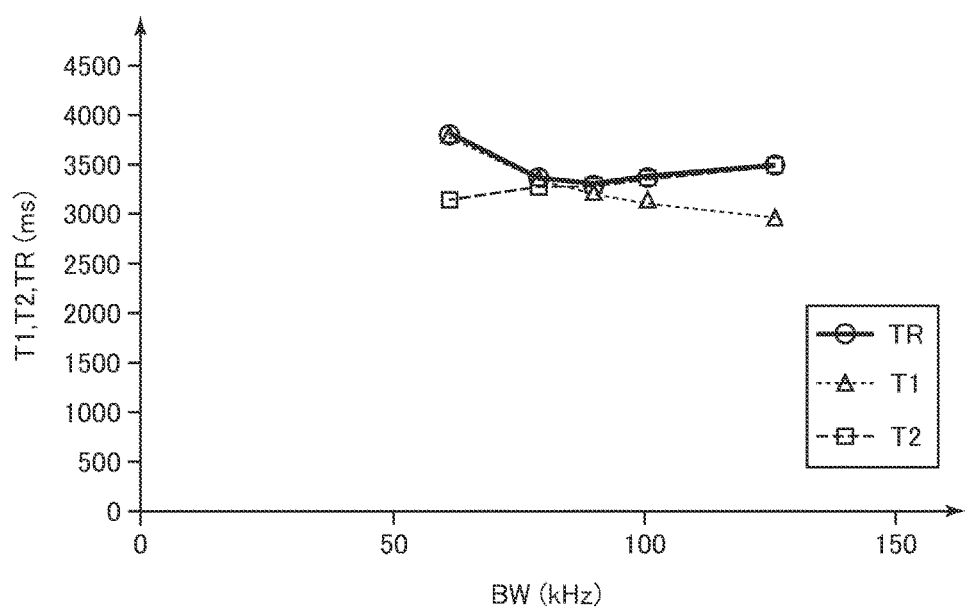
FIG. 6 is a diagram showing a general relationship between the repetition time TR and bandwidth BW.

FIG. 6 is a diagram showing a general relationship between the repetition time TR and bandwidth BW.

It is important for a gradient pulse to keep an area of its waveform in a pulse sequence that is defined in design. Accordingly, a large bandwidth BW can reduce the required time of a gradient pulse. That is, a first period of time T1 taken to perform a pulse sequence in one cycle from the start to the end is reduced for a larger bandwidth BW, while it is increased for a smaller bandwidth BW. On the other hand, an effective current flowing through the gradient coil is increased for a larger bandwidth BW, which increases the heating value resulting from a resistor component in the gradient coil. Consequently, a time required for heat radiation/cooling is increased because of the thermal design restrictions of the gradient coil, that is, in order to reduce damage or variation in property due to heat generation from the gradient coil. In other words, a second period of time T2 taken from the start of a pulse sequence in one cycle until a pulse sequence in a next cycle is ready to perform is increased for a larger bandwidth BW, while it is reduced for a smaller bandwidth BW.

Generally, the repetition time TR is dominated by the first period of time T1 and second period of time T2 described above, so that the repetition time TR cannot fall below a large one of these periods of time. Moreover, since the repetition time TR is directly reflected in the scan time ST, a shorter repetition time TR may be better unless it would affect others. Accordingly, it may be considered that the repetition time TR ordinarily selected for a certain bandwidth BW is a larger one of the first period of time T1 and second period of time T2 at that bandwidth BW. Such a repetition time TR varies following a downward convex curve for a change of the value of the bandwidth BW, and takes a minimum value at a certain bandwidth BW.

Thus, the minimum value of the repetition time TR varying for a change of the value of the bandwidth BW may be searched for to thereby identify an optimal bandwidth $BW_{tr\_min}$ that minimizes the repetition time TR. Methods of identifying such a bandwidth $BW_{tr\_min}$ may include, for example, a first identifying method and a second identifying method as given below.

To begin with, the first identifying method will be described. The first identifying method involves using a solution to a minimization problem to search for a bandwidth $BW_{tr\_min}$ that minimizes the repetition time TR. The solutions of a minimization problem may include, for example, a bisection method, a Newton's method, a gradient method, and a Monte Carlo method. Additionally, methods using the bisection method may include, for example, a method according to binary search, ternary search, and golden search using a golden ratio in segmentation of a region to be searched in the ternary search.

As an example of the first identifying method, a method according to binary search using a bisection method will be demonstrated here.

Figure 7:
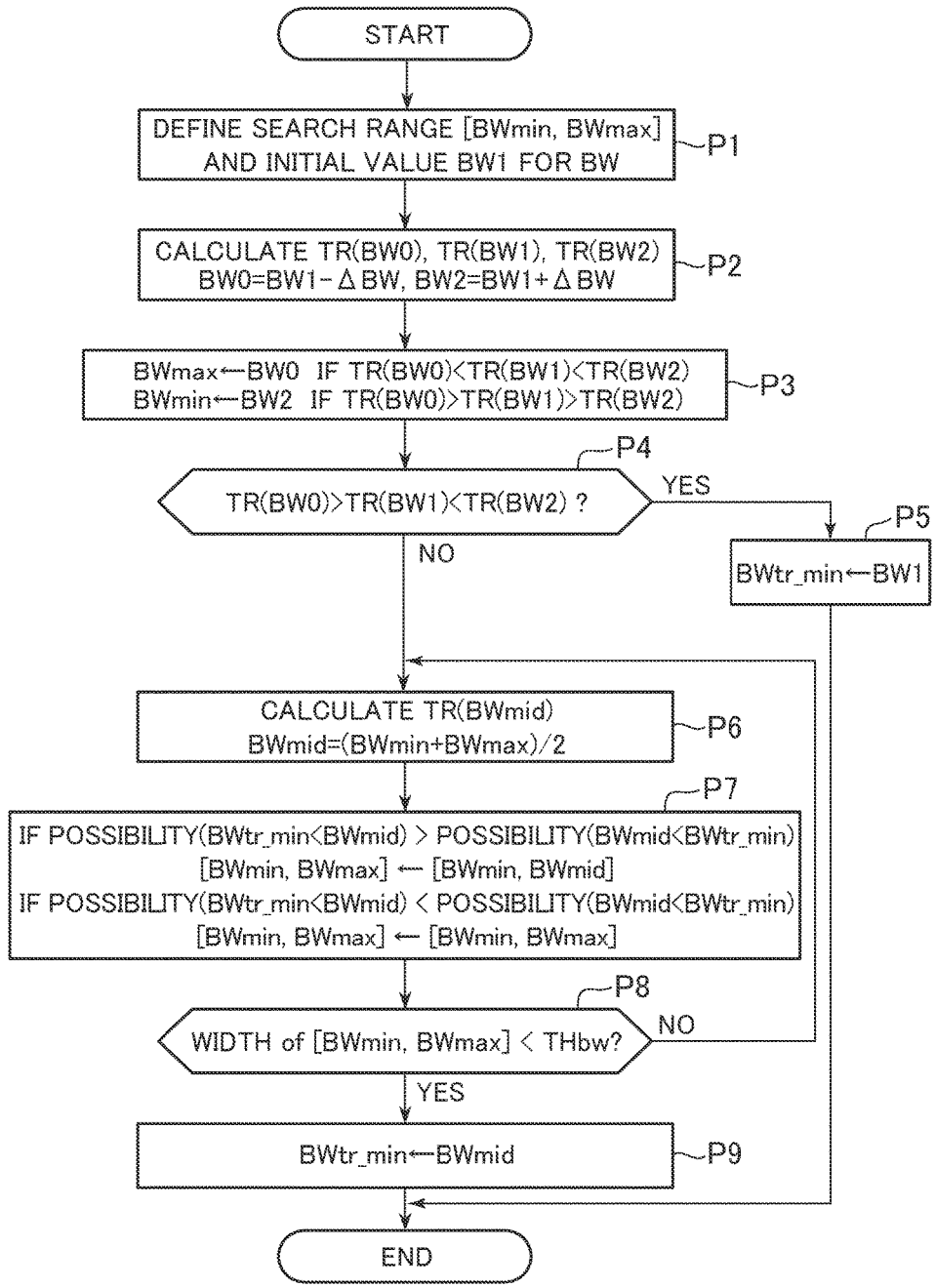
FIG. 7 is a flow chart of a method of searching for an optimal value of the bandwidth BW by binary search using a bisection method.

FIG. 7 is a flow chart of a method of searching for an optimal value of the bandwidth BW according to binary search using a bisection method.

At Step P1, as an upper-end value $BW_{max}$ and a lower-end value $BW_{min}$ within a region to be searched for the bandwidth BW, an upper-limit value $BW_{upper\_limit}$ and a lower-limit value $BW_{lower\_limit}$ of a variable range (allowable range) of the bandwidth BW are defined, respectively. Moreover, an initial value BW1 of the bandwidth BW at the start of search is defined.

At Step P2, with the definitions of the repetition time TR(BW)=max{T1(BW), T2(BW)}, BW0=BW1−ΔBW, and BW2=BW1+ΔBW (ΔBW>0), repetition times TR(BW1), TR(BW0), and TR(BW2) are calculated.

At Step P3, a decision is made as to whether a condition TR(BW0)<TR(BW1)<TR(BW2) is satisfied. In the case that the condition is satisfied, the upper-end value $BW_{max}$ is updated by copying BW0 thereto. In the case that the condition is not satisfied, an additional decision is made as to whether a condition TR(BW0)>TR(BW1)>TR(BW2) is satisfied. In the case that the condition is satisfied, the lower-end value $BW_{min}$ is updated by copying BW2 thereto. Thus, a region to be searched that may be considered as not including a minimum value $TR_{min}$ of the repetition time TR within the initially defined range to be searched is clipped away.

At Step P4, a decision is made as to whether a condition TR(BW0)>TR(BW1)<TR(BW2) is satisfied. When satisfied, the process goes to Step P5, wherein the value BW1 of the bandwidth BW is identified as a specific value $BW_{tr\_min}$ of the bandwidth BW that gives the minimal (shortest) repetition time TR, and the search processing is terminated. When not satisfied, the process goes to Step P6.

At Step P6, a middle value $(BW_{min}+BW_{max})/2$ in the region to be searched $[BW_{min}, BW_{max}]$ is set to $BW_{mid}$. Then, a repetition time $TR(BW_{mid})$ for a value of the bandwidth BW equal to the middle value $BW_{mid}$ is determined.

At Step P7, the repetition times $TR(BW_{min})$, $TR(BW_{mid})$, and $TR(BW_{max})$ are compared with one another, and one of a lower (left) region $[BW_{min}, BW_{mm}]$ and an upper (right) region $[BW_{mid}, BW_{max}]$ in the region to be searched $[BW_{min}, BW_{max}]$ that may be considered as not including the minimum value $TR_{min}$ of the repetition time TR is clipped away. Then, a new region to be searched $[BW_{min}, BW_{max}]$ is updated by copying the remaining region thereto.

That is, in the case that the possibility that $BW_{mid}<BW_{tr\_min}$ is higher than the possibility that $BW_{tr\_min}<BW_{mid}$, the upper (right) region $[BW_{mid}, BW_{max}]$ is kept while clipping the lower (left) region $[BW_{min}, BW_{mid}]$, and is set to the new region to be searched $[BW_{min}, BW_{max}]$. On the other hand, in the case that the possibility that $BW_{tr\_min}<BW_{mid}$ is higher than the possibility that $BW_{mid}<BW_{tr\_min}$, the lower (left) region $[BW_{min}, BW_{mid}]$ is kept while clipping the upper (right) region $[BW_{mid}, BW_{max}]$, and is set to the new region to be searched $[BW_{min}, BW_{max}]$. The possibility that $BW_{tr\_min}<BW_{mid}$ and the possibility that $BW_{mid}<BW_{tr\_min}$ are estimated from the repetition times $TR(BW_{min})$, $TR(BW_{mid})$, and $TR(BW_{max})$ based on the property of change of the repetition time TR with respect to the value of the bandwidth BW.

As a specific example, in the case that $TR(BW_{min})<TR(BW_{max})$, the possibility that $BW_{tr\_min}<BW_{mid}$ is considered to be higher than the possibility that $BW_{mid}<BW_{tr\_min}$ so that $BW_{mid}$ at the moment is set to next $BW_{max}$. On the contrary, in the case that $TR(BW_{min})>TR(BW_{max})$, the possibility that $BW_{mid}<BW_{tr\_min}$ is considered to be higher than the possibility that $BW_{tr\_min}<BW_{mid}$, so that $BW_{mid}$ at the moment is set to next $BW_{min}$.

At Step P8, a decision is made as to whether a condition that the width of the region to be searched $[BW_{min}, BW_{max}]$ <threshold $TH_{bw}$ is satisfied. Alternatively, a decision is made as to whether a condition that the number of refinements N in the region to be searched≥threshold $TH_n$ is satisfied. In the case that the condition is satisfied, the flow goes to Step P9, and a value within the region to be searched $[BW_{min}, BW_{max}]$, for example, the middle value $BW_{mid}$, is identified as the specific value $BW_{tr\_min}$ of the bandwidth BW that minimizes the repetition time TR. In the case that the condition is not satisfied, the flow goes back to Step P6 to continue the search processing.

Next, the second identifying method will be described. The second identifying method involves estimating a curved or straight line representing change of the first period of time T1 with respect to the value of the bandwidth BW and a curved or straight line representing change of the second period of time T2 with respect to the value of the bandwidth BW, and identifying a value of the bandwidth BW corresponding to an intersection of the two lines as the specific value $BW_{tr\_min}$ of the bandwidth BW that minimizes the repetition time TR.

As an example of the second identifying method, a method will be demonstrated, which involves estimating a straight line of change of the first period of time T1 and that of the second period of time T2, and identifying a value of the bandwidth BW corresponding to an intersection of the two straight lines.

Figure 8:
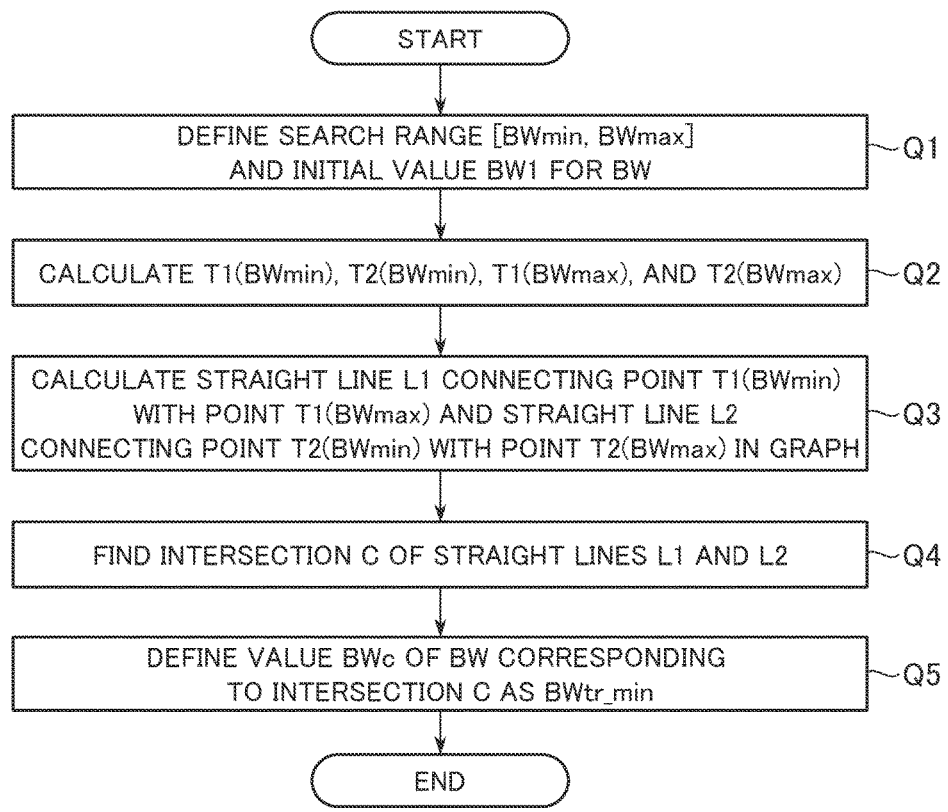
FIG. 8 is a flow chart of a method of estimating a straight line of change of a first period of time T1 and that of a second period of time T2, and identifying a value of the bandwidth BW corresponding to an intersection of the two straight lines.

FIG. 8 is a flow chart of the method of estimating a straight line of change of the first period of time T1 and that of the second period of time T2, and identifying a value of the bandwidth BW corresponding to an intersection of the two straight lines.

At Step Q1, as the upper-end value $BW_{max}$ and lower-end value $BW_{min}$ within a region to be searched for the bandwidth BW, an upper-limit value $BW_{upper\_limit}$ and a lower-limit value $BW_{lower\_limit}$ of a variable range (allowable range) of the bandwidth BW are defined, respectively.

At Step Q2, a first period of time $T1(BW_{min})$ and a second period of time $T2(BW_{min})$ when the bandwidth BW assumes the lower-end value $BW_{min}$, and a first period of time $T1(BW_{max})$ and a second period of time $T2(BW_{max})$ when the bandwidth BW assumes the upper-end value $BW_{max}$ are determined.

At Step Q3, in a graph having the repetition time TR and bandwidth BW as two axes, a first straight line L1 connecting a point $(BW_{min}, T1(BW_{max}))$ corresponding to the first period of time $T1(BW_{min})$ when the bandwidth BW assumes the lower-end value $BW_{min}$ with a point $(BW_{max}, T1(BW_{max}))$ corresponding to the first period of time $T1(BW_{max})$ when the bandwidth BW assumes the upper-limit value $BW_{max}$ is determined. Similarly, in the same graph, a second straight line L2 connecting a point $(BW_{min}, T2(BW_{min}))$ corresponding to the second period of time $T2(BW_{min})$ when the bandwidth BW assumes the lower-end value $BW_{min}$ with a point $(BW_{max}, T2(BW_{max}))$ corresponding to the second period of time $T2(BW_{max})$ when the bandwidth BW assumes the upper-end value $BW_{max}$ is determined.

At Step Q4, an intersection C of the first straight line L1 and second straight line L2 is found.

At Step Q5, a value $BW_c$ of the bandwidth BW corresponding to the intersection C is determined as the specific value $BW_{tr\_min}$.

Additionally, as one of methods of adjusting a pulse sequence, there may be a method of adjusting the pulse waveform so that the first period of time T1 is balanced with the second period of time T2. It has been shown that application of the pulse sequence adjustment method causes the first period of time T1 and second period of time T2 described above to make complicated motion with respect to change of the value of the bandwidth BW. That is, the repetition time TR that is a larger one of the first period of time T1 and second period of time T2 makes complicated motion with respect to change of the value of the bandwidth BW as well.

Figure 9:
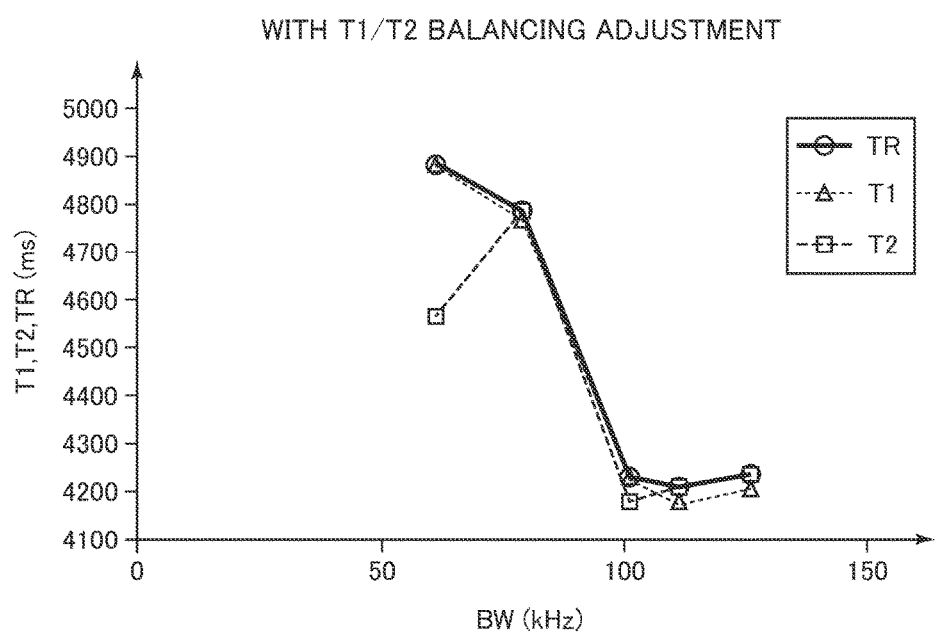
FIG. 9 is a diagram showing a relationship between the repetition time TR and the value of the bandwidth BW when a pulse sequence adjustment method is applied.

FIG. 9 is a diagram showing a relationship between the repetition time TR and the value of the bandwidth BW when the pulse sequence adjustment method is applied. In such a case, it is difficult to estimate the waveforms of the first and second periods of time as a waveform of a simple function. Accordingly, in identifying a specific value of the bandwidth BW that minimizes the repetition time TR, the first identifying method without estimation of the waveform may be used when a first mode that applies the pulse sequence adjustment method is selected, while the second identifying method with estimation of the waveform may be used when a second mode that applies no pulse sequence adjustment method is selected. Thus, balanced identification may be achieved such that when estimation of the waveform is easy, an optimal specific value of the bandwidth BW is efficiently identified by the estimation with a smaller processing volume, while when estimation of the waveform is difficult, an optimal specific value of the bandwidth BW is identified with higher reliability and accuracy even with a relatively large processing volume.

Since according to the present embodiment described above, a specific value of the bandwidth BW that minimizes the repetition time TR is determined by automatically searching for it, the need for an operation by the operator 14 of manually checking an optimal specific value of the bandwidth BW is eliminated, thus facilitating optimization of scan conditions. Consequently, a real-time operation and workflow of site protocol creation may be improved.

The embodiment of the invention is not limited to that described above and several modifications may be made without departing from the spirit and scope of the invention.

Moreover, while the embodiment above refers to a magnetic resonance imaging apparatus, a scan condition determining method and a scan condition determining apparatus that determine scan conditions by a similar method to that in the present apparatus each constitute one embodiment of the present invention. Furthermore, a program for causing a computer to execute processing according to such a scan condition determining method, and a computer-readable recording medium on which such a program is recorded also each constitute one embodiment of the present invention.

We claim:

1. A magnetic resonance (MR) apparatus, comprising:
a transmitter for driving a radio frequency (RF) coil;
a gradient magnetic field power source for driving a gradient coil; and
a central processing apparatus configured to:
set values of a plurality of parameters for an MR scan other than a repetition time and other than a bandwidth; and
determine a specific value of the bandwidth based on the set values of the plurality of parameters to minimize a repetition time which is the longer one of a first period of time and a second period of time, the first period of time being a time taken to perform a pulse sequence in one cycle, and the second period of time being a time taken from the start of a pulse sequence in one cycle until a pulse sequence in a next cycle is ready to perform, wherein determining the specific value of the bandwidth comprises obtaining the repetition time for the bandwidth assuming each of a plurality of mutually different values and determining the specific value based on the obtained repetition times;
wherein the transmitter and the gradient magnetic field power source are configured to perform the MR scan according to the specific value of the bandwidth, the minimized repetition time, and the set values of the plurality of parameters.

2. The MR apparatus of claim 1, wherein determining the specific value of the bandwidth comprises searching for the specific value using a solution to a minimization problem.

3. The MR apparatus of claim 1, wherein determining the specific value of the bandwidth comprises searching for the specific value using a bisection method.

4. The MR apparatus of claim 1, wherein determining the specific value of the bandwidth comprises searching for the specific value by binary search, ternary search or golden search.

5. The MR apparatus of claim 1, wherein determining the specific value of the bandwidth comprises searching for the specific value using a gradient method, a Newton's method or a Monte Carlo method.

6. The MR apparatus of claim 1, wherein determining the specific value of the bandwidth comprises:
when a first mode is selected where a pulse sequence is adjusted to balance the first period of time with the second period of time, obtaining the repetition time for the bandwidth assuming each of a plurality of mutually different values, and determining the specific value based on the obtained repetition times, and
when a second mode is selected where the pulse sequence is not adjusted, estimating a first curved or straight line representing change of the first period of time with respect to the bandwidth and a second curved or straight line representing change of the second period of time with respect to the bandwidth, and determining a value of the bandwidth corresponding to an intersection of the first and second curved or straight lines as the specific value.

7. The MR apparatus of claim 1, wherein the central processing apparatus is further configured to:
turn on/off of a function of automatically setting the bandwidth in response to an operation by an operator, and
determine the specific value when the function is turned on.

8. The MR apparatus of claim 1, wherein the MR scan is 3D-FSPGR (Three-dimensional fast spoiled gradient echo) or 2D/3D-SSFP (Two-dimensional/Three-dimensional steady state free precession).

9. An MR scan method performed by an MR apparatus, the method comprising:
setting values of a plurality of parameters for an MR scan other than a repetition time and other than a bandwidth;
determining a specific value of the bandwidth based on the set values of the plurality of parameters to minimize a repetition time which is the longer one of a first period of time and a second period of time, the first period of time being a time taken to perform a pulse sequence in one cycle, and the second period of time being a time taken from the start of a pulse sequence in one cycle until a pulse sequence in a next cycle is ready to perform, wherein determining the specific value of the bandwidth comprises obtaining the repetition time for the bandwidth assuming each of a plurality of mutually different values and determining the specific value based on the obtained repetition times; and
performing the MR scan according to the specific value of the bandwidth, the minimized repetition time, and the set values of the plurality of parameters.

10. The MR scan method of claim 9, wherein determining the specific value of the bandwidth comprises searching for the specific value using a solution to a minimization problem.

11. The MR scan method of claim 9, wherein determining the specific value of the bandwidth comprises searching for the specific value using a bisection method.

12. The MR scan method of claim 9, wherein determining the specific value of the bandwidth comprises searching for the specific value by binary search, ternary search or golden search.

13. The MR scan method of claim 9, wherein determining the specific value of the bandwidth comprises searching for the specific value using a gradient method, a Newton's method or a Monte Carlo method.

14. The MR scan method of claim 9, wherein determining the specific value of the bandwidth comprises:
when a first mode is selected where a pulse sequence is adjusted to balance the first period of time with the second period of time, obtaining the repetition time for the bandwidth assuming each of a plurality of mutually different values, and determining the specific value based on the obtained repetition times, and
when a second mode is selected where the pulse sequence is not adjusted, estimating a first curved or straight line representing change of the first period of time with respect to the bandwidth and a second curved or straight line representing change of the second period of time with respect to the bandwidth, and determining a value of the bandwidth corresponding to an intersection of the first and second curved or straight lines as the specific value.

15. The MR scan method of claim 9, further comprising:
turning on/off of a function of automatically setting the bandwidth in response to an operation by an operator, and
determining the specific value when the function is turned on.

16. The MR scan method of claim 9, wherein the MR scan is 3D-FSPGR (Three-dimensional fast spoiled gradient echo) or 2D/3D-SSFP (Two-dimensional/Three-dimensional steady state free precession).

17. An MR scan method performed by an MR apparatus, the method comprising:
setting values of a plurality of parameters for an MR scan other than a repetition time and other than a bandwidth;
determining a specific value of the bandwidth based on the set values of the plurality of parameters to minimize a repetition time which is the longer one of a first period of time and a second period of time, the first period of time being a time taken to perform a pulse sequence in one cycle, and the second period of time being a time taken from the start of a pulse sequence in one cycle until a pulse sequence in a next cycle is ready to perform,
wherein determining the specific value of the bandwidth comprises estimating a first curved or straight line representing change of the first period of time with respect to the bandwidth and a second curved or straight line representing change of the second period of time with respect to the bandwidth, and determining a value of the bandwidth corresponding to an intersection of said first and second curved or straight lines as said specific value; and
performing the MR scan according to the specific value of the bandwidth, the minimized repetition time, and the set values of the plurality of parameters.

* * * * *